United States Patent [19]
Hsu et al.

[11] Patent Number: 6,048,738
[45] Date of Patent: Apr. 11, 2000

[54] METHOD OF MAKING FERROELECTRIC MEMORY CELL FOR VLSI RAM ARRAY

[75] Inventors: Sheng Teng Hsu; Jong Jan Lee, both of Camas, Wash.

[73] Assignees: Sharp Laboratories of America, Inc., Camas, Wash.; Sharp Kabushiki Kaisha, Osaka, Japan

[21] Appl. No.: 08/870,375

[22] Filed: Jun. 6, 1997

Related U.S. Application Data

[63] Continuation-in-part of application No. 08/812,579, Mar. 7, 1997, Pat. No. 5,731,608.
[51] Int. Cl.$^7$ ....................................................... H01G 7/06
[52] U.S. Cl. .............................. 438/3; 438/240; 438/253
[58] Field of Search ............................... 438/3, 253–266, 438/240, 393–399; 257/295

[56] References Cited

U.S. PATENT DOCUMENTS

| | | | |
|---|---|---|---|
| 3,832,700 | 8/1974 | Wu et al. | 340/173.2 |
| 4,419,809 | 12/1983 | Riseman et al. | 29/591 |
| 4,888,630 | 12/1989 | Paterson . | |
| 5,070,029 | 12/1991 | Pfiester et al. | 437/29 |
| 5,300,799 | 4/1994 | Nakamura et al. | 257/295 |
| 5,303,182 | 4/1994 | Nakao et al. | 365/145 |
| 5,345,415 | 9/1994 | Nakao et al. | 365/145 |
| 5,365,094 | 11/1994 | Takasu | 257/295 |
| 5,373,462 | 12/1994 | Achard et al. | 365/145 |
| 5,416,735 | 5/1995 | Onishi et al. | 365/145 |
| 5,431,958 | 7/1995 | Desu et al. | 427/255.3 |
| 5,446,688 | 8/1995 | Torimaru | 365/145 |
| 5,612,238 | 3/1997 | Sato et al. . | |
| 5,780,886 | 7/1998 | Yamanobe . | |

FOREIGN PATENT DOCUMENTS

| | | |
|---|---|---|
| 4-256361 | 9/1992 | Japan . |
| 8-293565 | 11/1996 | Japan . |
| WO 96/13860 | 5/1996 | WIPO . |

OTHER PUBLICATIONS

Jiang et al. "A New Electrode Technology for High–Density Nonvolatile Ferroelectric (SrBi$_2$Ta$_2$O$_9$) Memories", IEEE 1996 Symposium on VLSI Technology Digest of Technical Papers, pp. 26–27, 1966.

Article entitled, Characteristics of NDRO Ferroelectric FETs with a Poly–Si Floating Gate, by T. Nakamura, Y. Nakao, A. Kamusawa and H. Takasu, published in 1995 IEEE proceedings, Aug., 1994, pp. 345–347, #XP000553149.

*Primary Examiner*—Jey Tsai
*Attorney, Agent, or Firm*—David C. Ripma; Matthew D. Rabdau

[57] ABSTRACT

A method of forming a semiconductor memory device on a silicon substrate includes implanting doping impurities of a first type in the silicon substrate to form a conductive channel of a first type for use as a gate junction region, forming a MOS capacitor on the conductive channel of the first type, depositing an FEM capacitor over the MOS capacitor, thereby forming a stacked gate unit, implanting doping impurities of a second type in the silicon substrate on either side of the gate junction region to form a conductive channel of a second type for use as a source junction region and a drain junction region, and depositing an insulating structure about the FEM gate unit. A ferroelectric memory (FEM) cell constructed according to the invention includes a silicon substrate, a gate region located in said substrate, a source junction region and a drain junction region located on either side of said gate region, a MOS capacitor, a FEM capacitor, wherein said FEM capacitor is stacked on and overlays at least a portion of said MOS capacitor, thereby forming, with said MOS capacitor, a stacked gate unit.

12 Claims, 7 Drawing Sheets

METHOD OF MAKING FERROELECTRIC MEMORY CELL FOR VLSI RAM ARRAY

RELATED APPLICATION

This application is a continuation-in-part of application Ser. No. 08/812,579, filed Mar. 7, 1997, now U.S. Pat. No. 5,731,608 of Hsu et al., for ONE TRANSISTOR FERROELECTRIC MEMORY CELL AND METHOD OF MAKING THE SAME.

BACKGROUND OF THE INVENTION

This application relates to ferroelectric thin films which are used in nonvolatile memories and specifically to a metal-ferroelectric-metal-silicon semi-conductor, also referred to herein as a ferroelectric memory (FEM) cell. Known ferroelectric random access memories (FRAM) are constructed with one transistor (1T) and one capacitor (1C). The capacitor is generally made by sandwiching a thin ferroelectric film between two conductive electrodes, which electrodes are usually made of platinum. The circuit configuration and the read/write sequence of this type of memory are similar to that of conventional dynamic random access memories (DRAM), except that no data refreshing is necessary in a FRAM. Known FRAMs have a fatigue problem that has been observed in the ferroelectric capacitor, which is one of the major obstacles that limit the viable commercial use of such memories. The fatigue is the result of a decrease in the switchable polarization (stored nonvolatile charge) that occurs with an increased number of switching cycles. As used in this case, "switching cycles" refers to the sum of reading and writing pulses in the memory.

Another known use of ferroelectric thin films in memory applications is to form a ferroelectric-gate-controlled field effect transistor (FET) by depositing the ferroelectric thin film directly onto the gate area of the FET. Such ferroelectric-gate controlled devices have been known for some time and include devices known as metal-ferroelectric-silicon (MFS) FETs. FRAMs incorporating the MFS FET structure have two major advantages over the transistor-capacitor configuration: (1) The MFS FET occupies less surface area, and (2) provides a non-destructive readout (NDR). The latter feature enables a MFS FET device to be read thousands of times without switching the ferroelectric polarization. Fatigue, therefore, is not a significant concern when using MFS FET devices. Various forms of MFS FET structures may be constructed, such as metal ferroelectric insulators silicon (MFIS) FET, metal ferroelectric metal silicon (MFMS) FET, and metal ferroelectric metal oxide silicon (MFMOS) FET.

There are a number of problems that must be overcome in order to fabricate an efficient MFS FET device. The first problem is that it is difficult to form an acceptable crystalline ferroelectric thin film directly on silicon. Such structure is shown in U.S. Pat. No. 3,832,700. Additionally, it is very difficult to have a clean interface between the ferroelectric material and the silicon. Further, there is a problem retaining an adequate charge in the ferroelectric material. A FEM structure on a gate region is shown in U.S. Pat. No. 5,303,182, which emphasizes that the transfer of metal ions into the gate region is undesirable. Similar structure is shown in U.S. Pat. No. 5,416,735.

It is an object of this invention to overcome the aforementioned problems.

Another object of the invention is to provide a FEM device which provides a non-destructive readout.

Yet another object of the invention to provide a FEM device that occupies a relatively small surface area.

A further object of the invention is to provide an FEM device which requires a relatively low programming voltage.

SUMMARY OF THE INVENTION

The method of forming a semiconductor memory device on a silicon substrate includes implanting doping impurities of a first type in the silicon substrate to form a conductive channel of a first type for use as a gate region, forming a MOS capacitor on the conductive channel of the first type, depositing an FEM capacitor over the MOS capacitor, including depositing a lower metal layer, a FE layer and an upper metal layer, thereby forming a stacked gate unit, implanting doping impurities of a second type in the silicon substrate on either side of the gate region to form a conductive channel of a second type for use as a source junction region and a drain junction region, and depositing an insulating structure about the FEM gate unit.

A ferroelectric memory (FEM) cell constructed according to the invention includes a silicon substrate, a gate region located in said substrate; doped to form a conductive channel of a first type, a source junction region and a drain junction region located in the substrate on either side of the gate region, doped to form a pair of conductive channels of a second type, a MOS capacitor, including an oxide layer and a conductive layer of a third type located over the gate junction region, wherein the MOS capacitor has a predetermined surface area, a FEM capacitor, including a lower metal layer, a FE layer and an upper metal layer; wherein the FEM capacitor is stacked on and overlays at least a portion of the MOS capacitor, thereby forming, with the MOS capacitor, a stacked gate unit, an insulating layer, having an upper surface, overlying the junction regions, the stacked gate unit, and the substrate, and a source electrode and a drain electrode, each located on the upper surface of the insulating layer and extending therethrough to make electrical contact with their respective junction regions, and a gate electrode located on the upper surface of said insulating layer and extending therethrough to make electrical contact with the upper metal layer of the stacked gate unit.

These and other objects and advantages of the invention will become more fully apparent as the description which follows is read in conjunction with the drawings.

DETAILED DESCRIPTION OF THE PREFERRED EMBODIMENTS

As previously noted, the invention is a method of making a MFMOS memory cell which includes a ferroelectric (FE) capacitor, or FEM gate unit, located on top of a MOS capacitor, the two devices being collectively referred to herein as a stacked gate unit. In one embodiment of the invention, the area of the MOS capacitor is greater than that of the ferroelectric capacitor, which increases the coupling efficiency and lowers the programming voltage of the device. A second embodiment is described wherein a second transistor is formed alongside the stacked MOS and FE capacitors, and includes placing a ferroelectric capacitor on top of a MOS capacitor. The differentially sized structure, is also referred to as an off-set gate ferroelectric memory cell. A third embodiment includes a MOS capacitor stacked with a FE capacitor, wherein both capacitors have the same size footprint.

The stacked ferroelectric memory gate unit of the invention may be formed on a SOI (SIMOX) substrate, or, it may be formed in a bulk silicon substrate which has a $p^-$ well formed therein. As used herein, "silicon substrate" means a SOI substrate, a bulk silicon substrate, or any other type of substrate which contains silicon as a component thereof and which is suitable for use with the invention.

When a bulk substrate is used, the substrate is a $n^-$ type. The initial step is to fabricate $n^-$ well and $p^-$ well structures, isolate these structures, and implant appropriate ions to provide threshold voltage adjustment for the transistors. When a SOI substrate is used, it is not necessary to form either the $n^-$ well or the $p^-$ well.

Figure 1:
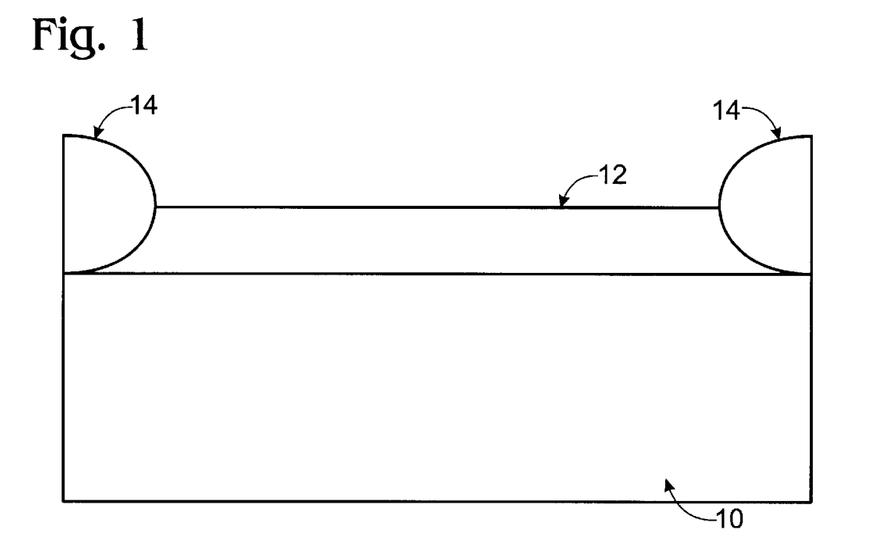
FIG. 1 depict a silicon substrate which has been prepared to facilitate the construction of a FEM cell according to the invention.

Turning now to FIG. 1, a silicon substrate is depicted at 10. Substrate 10, in the preferred embodiment is a single-crystal substrate, and is formed of bulk silicon. As depicted in FIG. 1, substrate 10 is formed of $n^-$ silicon. The $p^-$ well 12 may be formed by implanting B or $BF_2$ ions into the surface of the substrate, followed by a thermal diffusion step at temperatures ranging between 950° C. to 1200° C. for one to four hours. Boron ions may be implanted at an energy of 3 keV to 10 keV, while $BF_2$ ions are implanted with an energy level of between 15 keV and 50 keV. Ion concentration in both instances are in the range of $1 \cdot 10^{12} cm^{-2}$ to $1 \cdot 10^{14} cm^{-2}$.

To isolate the device insulating regions 14, formed of $SiO_2$, are grown on the substrate before the $p^-$ well 12 is formed. As is well known to those of a skill in the art, a multiplicity of such regions are formed on the surface of a silicon wafer. For the structure of the invention, the cells are arranged in a perpendicular grid of gate to drain and $p^-$ well to form a memory array.

Figure 2:
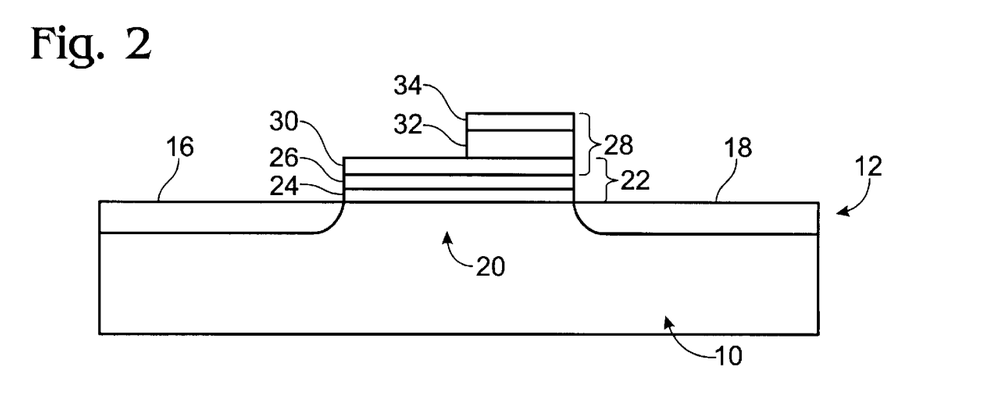
FIG. 2 depicts a single transistor offset stacked gate unit constructed according to the invention.

Turning now to FIG. 2, a single transistor memory cell of the invention will be described. As depicted in FIG. 2, active region 12 has been modified to contain two $n^+$ regions 16 and 18, which will ultimately serve as the source and drain, respectively, for the memory cell. A $p^-$ well channel region 20, referred to herein as a conductive channel of a first type remains from substrate 10. Source region 16 and drain region 18 are formed by implanting appropriate ions, referred to herein as doping impurities of a second type, in active region 12 to form the two $n^+$ regions, also referred to herein as conductive channels of a second type. Appropriate ion implantation in this instance may be the implantation of As ions at a preferred energy of about 50 keV, although implantation in a range of 40 keV to 80 keV is acceptable, and a dosing in a range of $1 \cdot 10^{15} cm^{-2}$ to $5 \cdot 10^{15} cm^{-2}$. Alternately, phosphorus ions may be implanted in an energy range of 20keV–50 keV in the same dosing range.

A MOS capacitor 22 is formed by growth of a thin layer of thermal oxide 24 onto $p^-$ channel 20, following appropriate masking. In the preferred embodiment, layer 24 has a thickness in a range of between 3 nm and 10 nm. A optional $n^+$ polysilicon layer 26 is formed by CVD to a thickness of 100 nm to 300 nm, to complete MOS capacitor 22. The $n^+$ polysilicon acts as a buffer layer to release the stress between the bottom electrode of a FEM capacitor and the underlying oxide.

At this point, formation of the FEM capacitor gate unit may begin. FEM gate unit 28 includes a lower metal layer, or electrode, 30, the ferroelectric (FE) material 32, and an upper metal layer, or electrode, 34. The construction of FEM gate unit 28 begins with the deposition of the lower electrode on MOS capacitor 22. Lower electrode 30 may be formed of Pt, Ir, $IrO_2$, or an alloy of Pt/Ir, or other suitable conductive material. The thickness of this metal is 20 nm to 100 nm, in the preferred embodiment. Lower electrode 30 and the $n^+$ polysilicon layer, when used, form the upper electrode of MOS capacitor 22.

Next, the FE material is deposited by chemical vapor deposition (CVD). The FE material may be any of the following: $Pb(Zr, Ti)O_3$ (PZT), $SrBi_2Ta_2O_9$ (SBT), $Pb_5Ge_3O_{11}$, $BaTiO_3$, $LiNbO_3$, or other suitable ferroelectric material. The preferred compounds are, in order of preference, $Pb_5Ge_3O_{11}$, SBT and PZT. Most of the experimental work in the FEM gate unit field has been done on PZT compounds. The FE material 32 is deposited to a thickness of 50 nm to 400 nm.

The upper electrode 34 is then formed over the FE material. The upper electrode may be formed of the same materials as the lower electrode, to a thickness of 20 nm to 200 nm, forming a stacked gate unit, including FEM gate unit 28 and MOS capacitor 22. This particular embodiment features an offset FEM gate unit, in that the FEM gate unit covers less than the entire surface area of the MOS capacitor.

Figure 3A:
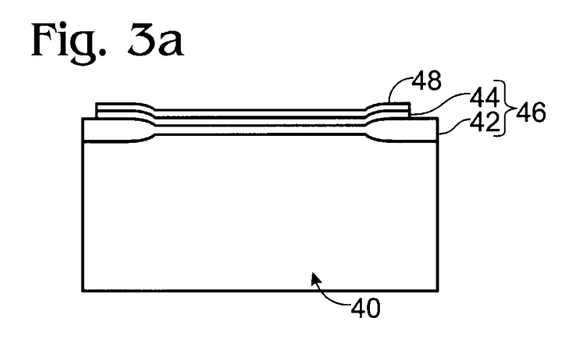
FIGS. 3a–3b, 4a–4b, 5a–5b, 6a–6b, 7a–7b depict successive steps in the construction of a stacked transistor gate constructed according to the invention.
Figure 3B:
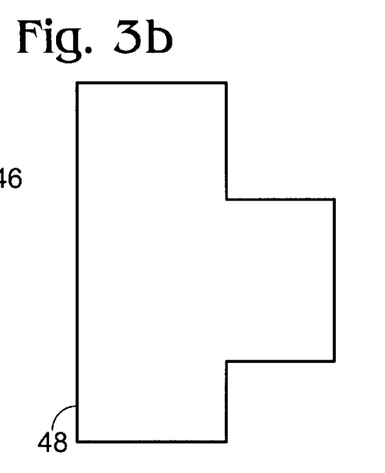

The structure depicted in FIG. 2 is completed by depositing a suitable insulating material, such as $TiO_x$, $Si_3N_4$, or other suitable barrier insulation material, over the memory cell. A thick layer of interlevel dielectric is formed, and suitable contacts for the source, gate and drain regions are installed. Referring now to FIGS. 3a and 3b, the construction and structure of a two transistor memory cell having a stacked gate unit will be described. In this instance, the structure is formed on a silicon substrate 40 which has an oxide layer 42 formed thereover. Regions for the source, drain, and gate may be formed at this step of the method, or may be formed later. In any event, a layer of $n^+$ polysilicon 44 is deposited, preferably by CVD which, with oxide layer 42, forms a MOS capacitor 46. A lower metal layer, or electrode 48, is then formed over the $n^+$ polysilicon layer 44, as previously described. A top plan view of lower metal layer 48 is depicted in FIG. 3b.

Figure 4A:
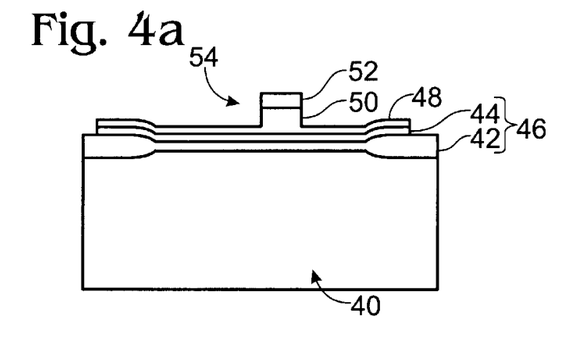
Figure 4B:
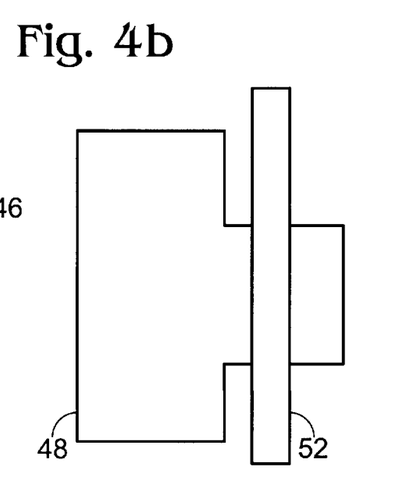

In the next step, ferroelectric material 50 is deposited over bottom electrode 48, as described in connection with the single transistor embodiment hereof, and an upper metal layer 52 is then formed. Top plan views of the lower metal layer 48 and upper metal layer 52 are depicted in FIG. 4b. The upper and lower metal layers and the FE material comprise an FEM gate unit 54.

Figure 5A:
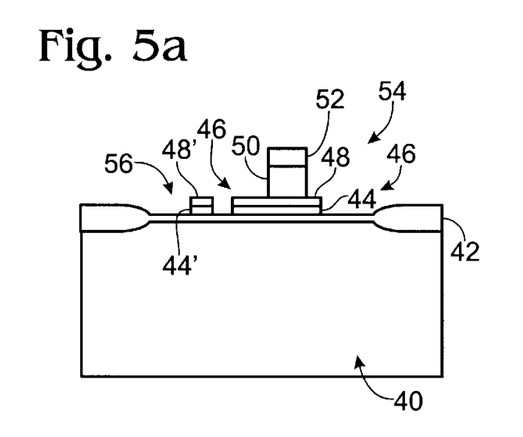
Figure 5B:
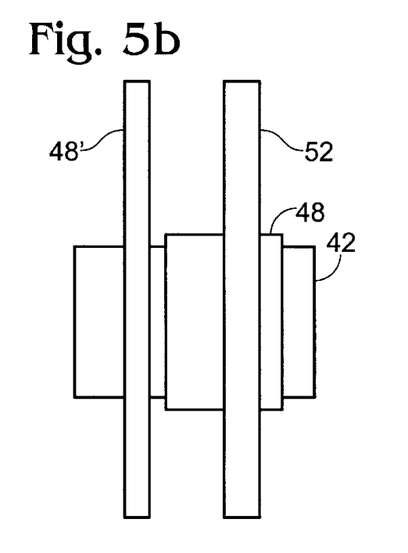
Figure 6A:
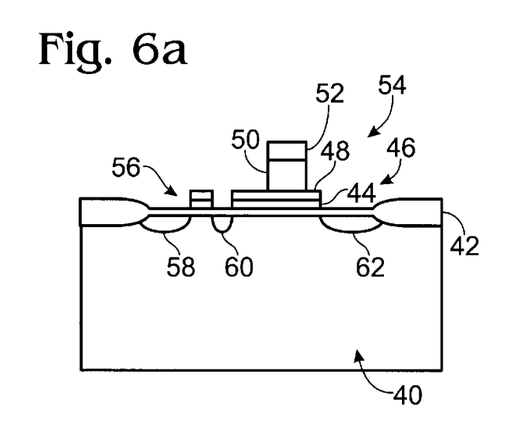
Figure 6B:
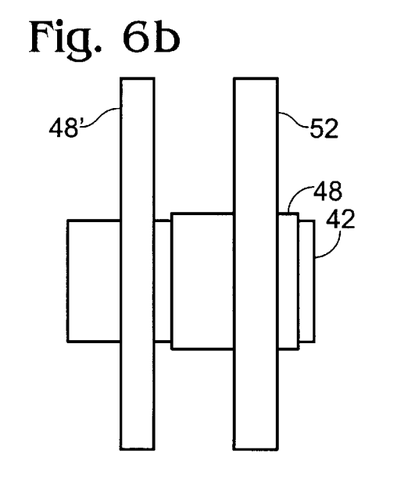

Photoresist is applied and lower electrode 48 and the $n^+$ polysilicon layer 44 are etched, resulting in the configuration depicted in FIG. 5. The structure shown in FIG. 5 includes a second transistor 56 which includes portions of oxide layer 42, $n^+$ polysilicon layer 44' and lower metal layer 48', which components are designated as "primes." The previously applied photoresist is stripped away, a new photoresist is applied, and impurities of a second type, as previously described, are implanted to form n+ regions 58, 60, 62, depicted in FIG. 6, which are referred to herein as conductive channels of a second type.

Figure 7A:
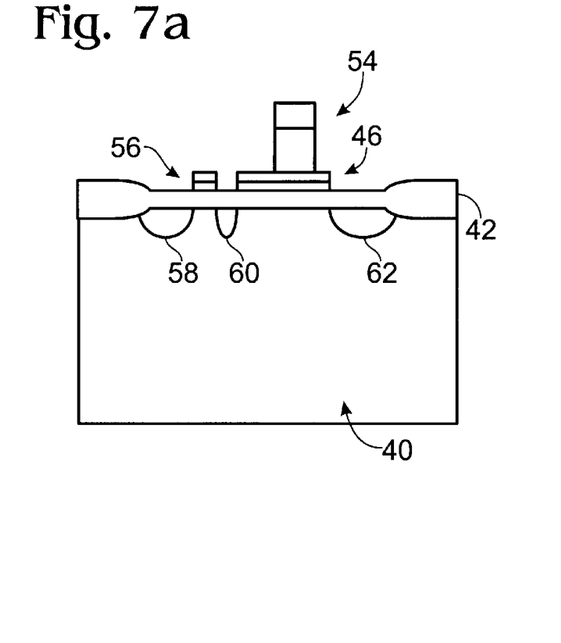
Figure 7B:
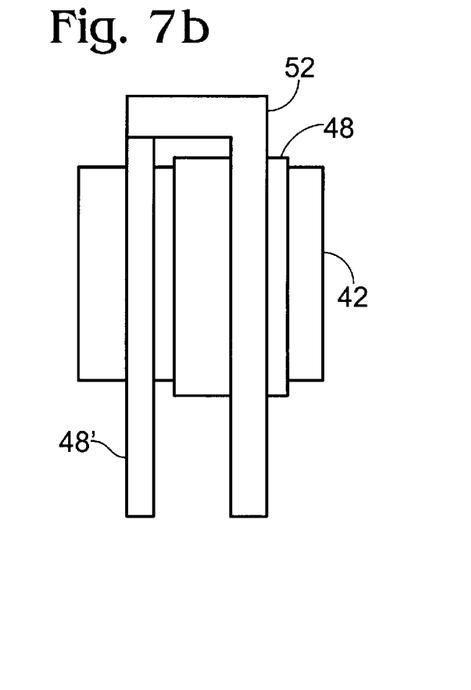

Referring now to FIG. 7, the existing photoresist is stripped away, the wafer is passivated with a layer of suitable insulation, new photoresist is applied to open contact holes and the first interconnect metal is defined, which results in upper metal layer 52 being electrically joined to metal layer 48'.

This configuration has the advantage of having a low leakage current. The device leakage current is limited by the MOS transistor current.

Figure 8:
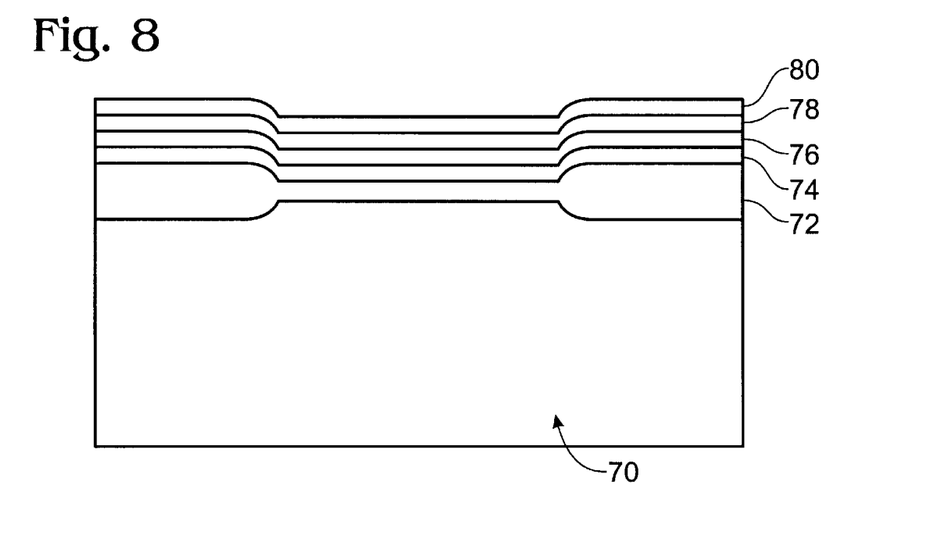
FIGS. 8–11 depict successive steps in the construction of a variation of the single transistor stacked gate unit constructed according to the invention.

The next embodiment of the invention again starts with a silicon substrate as previously described. Referring to FIG. 8, a p− well 70, has an oxide layer 72 formed thereover. Additional layers are deposited thereover in sequence, and include an n+ polysilicon layer 74, a lower metal layer 76, a FE layer 78, and an upper metal layer 80.

Figure 9:
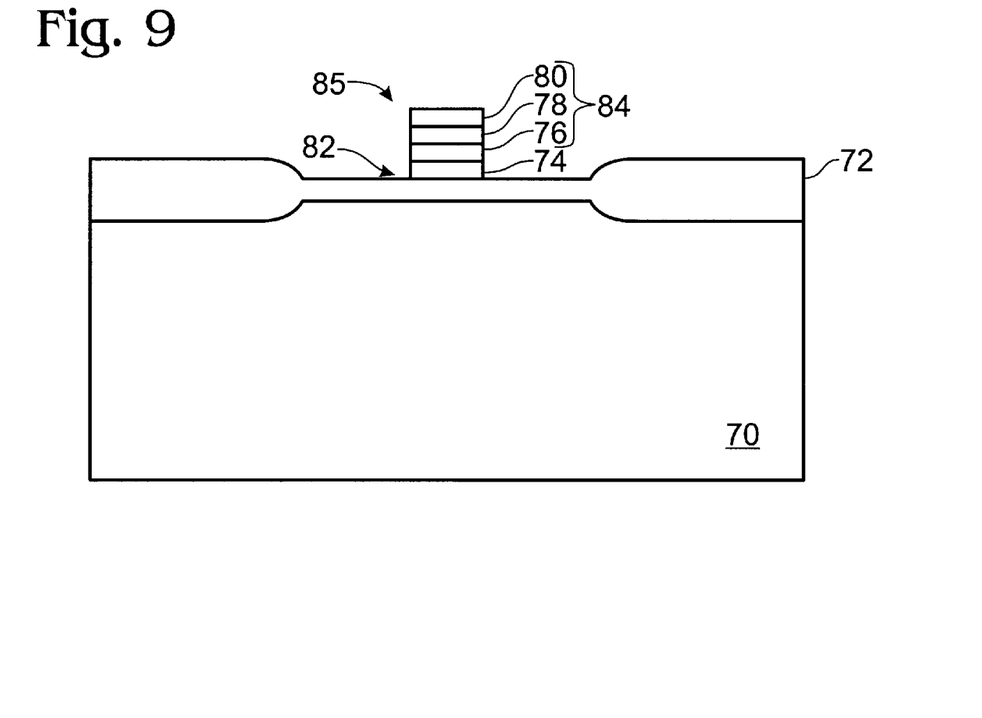
Figure 10:
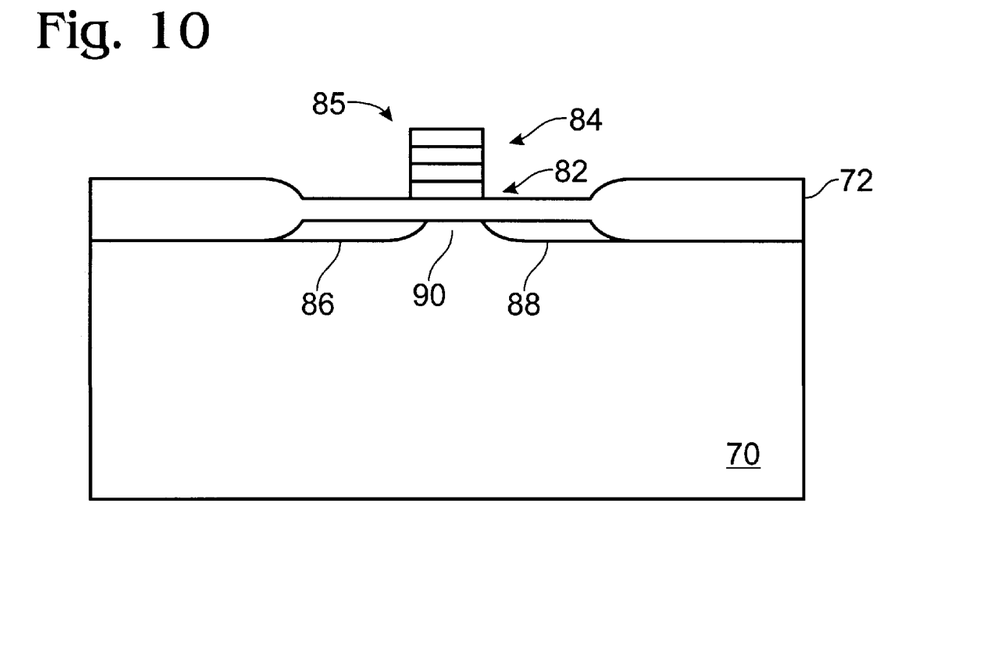

Photoresist is applied and the structure is etched, resulting in the configuration shown in FIG. 9, which includes a MOS capacitor 82 and a FEM gate unit, or capacitor, 84, formed into a stacked gate unit 85. At this point, a layer of insulating material, such as $TiO_x$, or other suitable insulating material may be applied in order to protect the ferroelectric. Then, n+ ions are implanted to form a n+ source region 86 and n+ drain region 88. The remaining p− material, depicted at 90, provides a gate channel.

Figure 11:
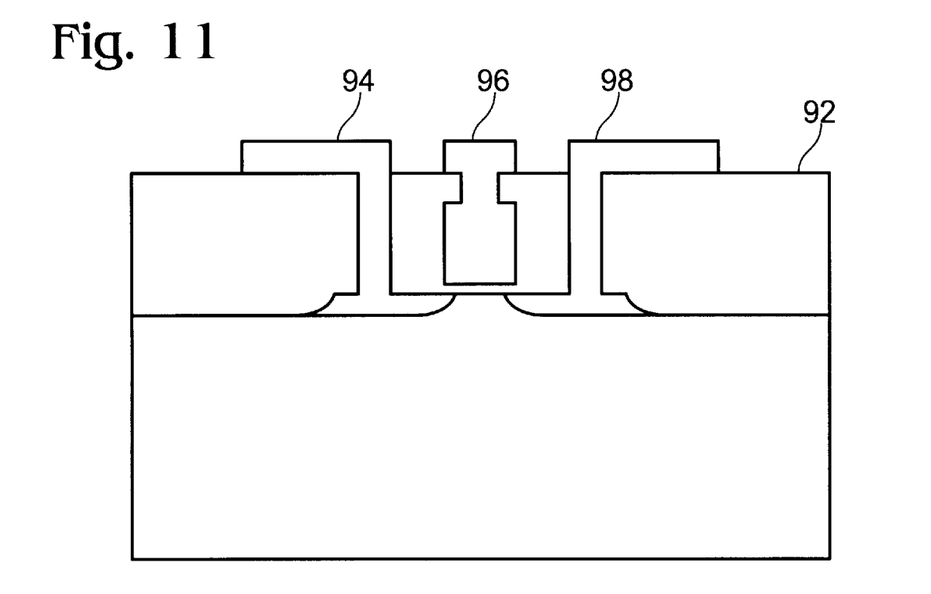

Referring now to FIG. 11, the final structure is depicted, with an insulating layer 92 in place, which includes a source electrode 94, a gate electrode 96, and a drain electrode 98.

This particular embodiment provides for a very small cell size. The device is exceptionally suitable for use in VLSI memory applications.

Programming to High Threshold State

Figure 12:
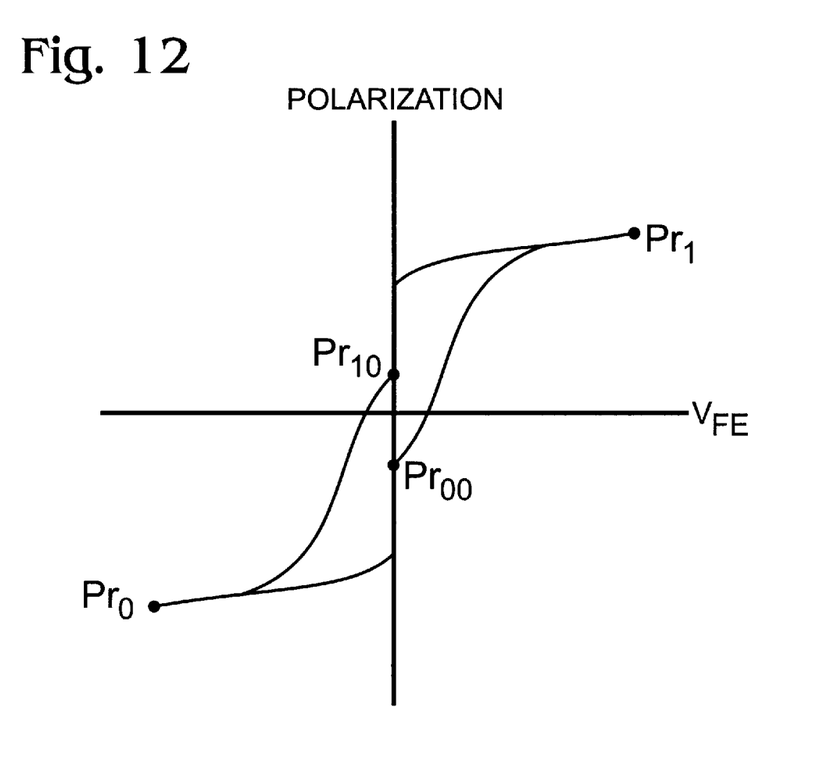
FIG. 12 is a graph of the P-E hysteresis loop of the FE used in the invention.

FIG. 12 depicts the P-E hysteresis loop of the ferroelectric material used in the memory cells described herein. Pr is the polarization value of the ferroelectric material. $Pr_0$ is negative polarity saturation polarization. $Pr_{00}$ is the polarization of the ferroelectric material after relaxation of the device after it has been programmed to a high threshold voltage state. $Pr_1$ is the positive polarity saturation polarization. $Pr_{10}$ is the polarization of the ferroelectric material after relaxation of the device after it has been programmed to a low threshold voltage state.

Figure 13A:
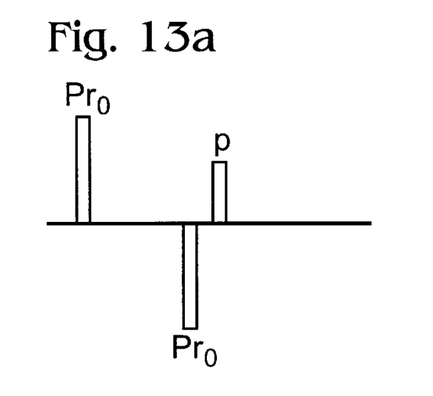
FIGS. 13a and 13b are graphs of charge distribution of the device of the invention in a "0" state and a "1" state, respectively.
Figure 13B:
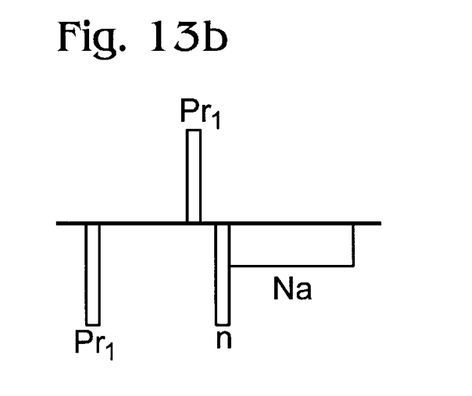

The charge distribution of a device constructed according to the invention is depicted in FIG. 13, wherein FIG. 13a depicts the charge distribution when the device is programmed to a "0" state and FIG. 13b depicts the charge when the device is programmed to the "1" state. In order to program the memory transistor to a "0" state for a large positive threshold voltage, such that the device is nonconductive at normal operation voltage, a negative voltage is applied to the control gate and results in the charge distribution as shown in FIG. 13a. The Poison's equation is $$\frac{d^2V}{dx^2} = \frac{qp}{\varepsilon_{OX}}[\partial(x)\partial(x=T_{OX})] + \frac{Pr_0 qp}{\varepsilon_{FE}}\partial(x=T_{OX}) \tag{1}$$

Integrate twice yields $$V_{P0} = V_{FB}\frac{qp}{C_{SI}} + \frac{Pr_0 qp}{C_{FE}} \tag{2}$$

where $Pr_0$ is shown in FIG. 12. The voltage drop across the ferroelectric capacitor is $$V_{FE} = \frac{Pr_0 qp}{C_{FE}} \tag{3}$$

Therefore the programming voltage is $$V_{P0} = V_{FB}\frac{Pr_0}{C_{OX}} + V_{FE}\left(1 + \frac{C_{FE}}{C_{OX}}\right) \tag{4}$$

The threshold voltage after programming is $$V_{T0} = V_{FB} + 2\phi_{FP} + \frac{\sqrt{4\phi_{FP}\varepsilon_{SI}qN_A}}{C_{OX}} + \frac{\sqrt{4\phi_{FP}\varepsilon_{SI}qN_A}}{C_{FE}} + Pr_{00} \tag{5}$$

where $Pr_{00}$ is the polarization of the ferroelectric material after relaxation from the programming the device to high threshold voltage.

Program to Low Threshold Voltage State

To program the memory to a low threshold voltage, i.e., "1" state, a positive voltage, $V_{P1}$, is applied to the gate and a negative voltage, $V_{D1}$, to the drain and p− well. The p− well is not required when the device is made on a SOI substrate. The source is at the ground potential. The charge distribution is sketched in FIG. 13b. The Poison's equation is:

$$\frac{d^2V}{dx^2} = \frac{qN_A}{\varepsilon_{SI}}[U(x)U(xw)] + \tag{6}$$

$$\frac{qN_A W + qn}{\varepsilon_{OX}}[\partial(x=W)\partial(x=W+T_{OX})] + \frac{[qN_A W + qn]Pr_1}{\varepsilon_{FE}}$$

Integrate Eq. (6) twice $$V_{P1} = V_{FB} + 2\phi_{FP} + \frac{qN_A W + qn}{C_{OX}} + \frac{[qN_A W + qn]Pr_1}{C_{FE}}V_{DI} \tag{7}$$

Equation (7) can be rewritten as $$V_{PI} = V_{FB} + 2\phi_{FP} + \frac{\sqrt{4q\varepsilon_{SI}N_A\phi_{FP}} + qn}{C_{OX}} + \tag{7a}$$

$$\frac{\left[\sqrt{4q\varepsilon_{SI}N_A\phi_{FP}} + qn\right]Pr_1}{C_{FE}} + V_{DI}$$

The voltage drop from the surface inversion layer to the top electrode of the ferroelectric capacitor is $$V_{PI}V_{DI} = V_{FB} + \frac{\sqrt{4q\varepsilon_{SI}N_A\phi_{FP}} + qn}{C_{OX}} + \frac{\left[\sqrt{4q\varepsilon_{SI}N_A\phi_{FP}} + qn\right]Pr_1}{C_{FE}}$$

The voltage drop in the ferroelectric capacitance is $$V_{FE} = \frac{[\sqrt{4q\varepsilon_{SI}N_A\phi_{FP}} + qn]Pr_1}{C_{FE}} \quad (8)$$

Therefore the supply voltage is $$V_{PI} + V_{DI} = V_{FB} + \frac{Pr_1}{C_{OX}} + V_{FE}\left(1 + \frac{C_{FE}}{C_{OX}}\right) \quad (7c)$$

The threshold voltage is $$V_{TI} = V_{FB} + 2\phi_{FP} + \frac{\sqrt{4q\varepsilon_{SI}N_A\phi_{FP}}}{C_{OX}} + \frac{\sqrt{4q\varepsilon_{SI}N_A\phi_{FP}}\,Pr_{10}}{C_{FE}} \quad (9)$$

where $Pr_{10}$ is the polarization charge after relaxation from the programming to the low threshold voltage state. Thus by (1) increasing channel doping density, $N_A$, (2) decreasing the ferroelectric capacitance by selecting lower dielectric constant material and/or increasing the thickness of the ferroelectric film, and (3) increasing the gate oxide capacitance, $C_{OX}$, by using thinner thermal oxide, the threshold voltage of the device at the "0" state can be larger than 0.0 V. This is the essential condition for one transistor RAM VLSI array. The result also clearly indicates that when the oxide capacitance is increased the programming voltage can be small.

The programming voltage and the threshold voltage of the device under various polarization conditions are calculated from the above equations and are shown in Table I, where the programming voltages and the channel doping density are adjusted to yield the "1" state threshold voltage of $V_{T1}$=0.6V. The polarization charge during programming is assumed to be 36% higher than the steady state polarization. We further assumed that the thickness of the ferroelectric material is 300 nm and its capacitance is $2.9\cdot10^{-7}$F/cm$^2$. The voltage dropping across the ferroelectric during programming is 3V. Two gate oxide thickness, i.e., 5 nm and 6 nm, have been evaluated. The memory window, $\Delta V_{TH}$, is shown in the last column of Table I and is illustrated in FIG. 14b.

TABLE I

| $Pr_{00} = Pr_1$ | $T_{ox} = 5$ nm | | | $T_{ox} = 6$ nm | | | |
|---|---|---|---|---|---|---|---|
| | Dopant | $V_{p1}$ | $V_{p0}$ | Doping | $V_{p1}$ | $V_{p0}$ | $\Delta V_{TH}$ |
| 0.50 | 1.44 | 5.70 | −4.70 | 1.23 | 5.28 | −3.53 | 4.05 |
| 0.75 | 6.00 | 5.95 | −4.45 | 5.22 | 5.71 | −3.09 | 5.78 |
| 1.00 | 13.69 | 6.20 | −4.20 | 11.97 | 6.15 | −2.65 | 7.50 |
| 1.25 | 24.50 | 6.45 | −3.95 | 21.48 | 6.59 | −2.21 | 9.23 |
| 1.50 | 38.44 | 6.70 | −3.70 | 33.76 | 7.03 | −1.78 | 10.95 |
| 1.75 | 55.50 | 6.95 | −3.45 | 48.79 | 7.46 | −1.34 | 12.68 |
| 2.00 | 75.69 | 7.20 | −3.20 | 66.59 | 7.90 | −0.90 | 14.40 |
| 2.25 | 99.00 | 7.45 | −2.95 | 87.14 | 8.34 | −0.46 | 16.13 |
| 2.50 | 125.44 | 7.70 | −2.70 | 110.46 | 8.78 | −0.03 | 17.85 |

Figure 14A:
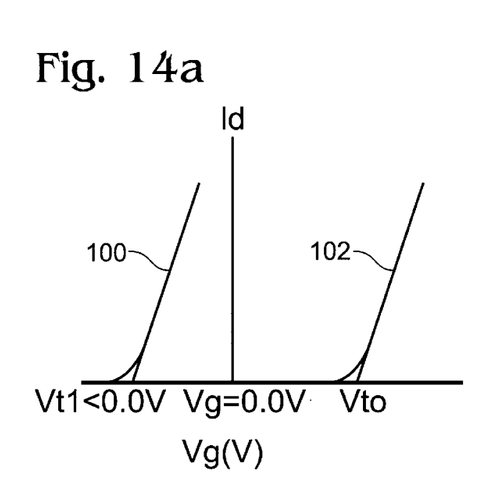
FIGS. 14a–14b is a graph of $I_D$ vs. $V_G$ for the FEM gate unit of the invention.
Figure 14B:
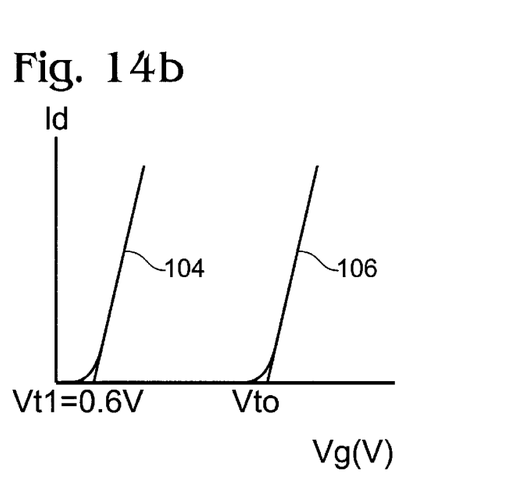

Referring now to FIG. 14a, a plot of $I_D$ versus $V_G$ for prior art devices is depicted. Line 100 represents the situation where $V_{t1}$ is less than zero, while $V_{t0}$ is a positive value. A structure having such a characteristic requires at least two devices (one memory transistor and one normal transistor) for use in a RAM array, and will require a relatively large programming voltage if used in a one transistor RAM array.

FIG. 14b depicts the "1" threshold voltage, line 104, and a "0" threshold voltage, line 106, for the devices formed according to the method of the invention.

Thus, a FEM memory cell, and a method of constructing same has been disclosed. Although a preferred embodiment of the invention has been disclosed, it should be appreciated that further variations may be made to the architecture and method without departing from the scope of the invention as defined in the appended claims.

We claim:

1. A method of forming a semiconductor memory device on a silicon substrate, comprising:
   implanting doping impurities of a first conductivity type in the silicon substrate to form a conductive channel of a first conductivity type for use as a gate region;
   forming a MOS capacitor on the conductive channel of the first conductivity type, said MOS capacitor having a predetermined surface area;
   depositing an FEM capacitor over the MOS capacitor to form a stacked gate unit, including depositing a lower metal layer on said MOS capacitor, said lower metal layer providing a lower electrode of said FEM capacitor and an upper electrode of said MOS capacitor;
   depositing a FE layer, and an upper metal layer to complete said FEM capacitor, the surface area of said FEM capacitor being less than said predetermined surface area of said MOS capacitor, whereby said stacked gate unit is in the form of an offset gate;
   implanting doping impurities of a second conductivity type in the silicon substrate on either side of the gate junction region to form a conductive channel of a second conductivity type for use as a source junction region and a drain junction region; and
   depositing an insulating structure about the FEM gate unit.

2. The method of claim 1 wherein forming a conductive channel of the first conductivity type includes implanting a dopant taken from the group consisting of B or BF$_2$ at an energy in a range of 3 keV to 10 keV or 15 keV to 50 keV, respectively, and a dose of $1\cdot10^{12}$cm$^{-2}$ to $1\cdot10^{14}$cm$^{-2}$.

3. The method of claim 1 wherein said steps of depositing an FEM capacitor includes depositing a lower metal layer of material taken from the group consisting of Pt, Ir, IrO$_2$ and Pt/Ir alloy, having a thickness of about 20 nm to 100 nm, depositing a FE layer of material taken from the group consisting of Pb(Zr, Ti)O$_3$ (PZT), SrBi$_2$Ta$_2$O$_9$ (SBT), Pb$_5$Ge$_3$O$_{11}$, BaTiO$_3$ and LiNbO$_3$, having a thickness of about 50 nm to 400 nm, and depositing an upper metal layer of material taken from the group consisting of Pt, Ir, IrO$_2$ and Pt/Ir alloy, having a thickness of 20 nm to 100 nm.

4. The method of claim 1 wherein said step of implanting doping impurities of the second conductivity type includes doping the device area with ions taken from the group consisting of As, implanted at an energy of about 40 keV to 80 keV, and phosphorous, implanted at an energy of about 20 keV to 50 keV, the ions having a dose of about $1\cdot10^{15}$cm$^{-2}$ to $5\cdot10^{15}$cm$^{-2}$.

5. The method of claim 1 wherein said depositing an insulating structure about the FEM capacitor and MOS capacitor includes depositing a layer of insulating material taken from the group consisting of TiO$_x$ and Si$_3$N$_4$.

6. The method of claim 1 which includes forming a second MOS capacitor alongside the stacked gate unit.

7. A method of forming a semiconductor structure having a ferroelectric memory (FEM) unit on a silicon substrate, comprising:
   implanting doping impurities of a first conductivity type in the silicon substrate to form a conductive channel of a first conductivity type for use as a gate region;
   forming a MOS capacitor on the substrate, including forming a layer of oxide on the conductive channel of the first conductivity type and forming a layer of n⁺ polysilicon thereover, said MOS capacitor having a predetermined surface area;

depositing an FEM capacitor over the MOS capacitor to form a stacked gate unit, including depositing a lower metal layer on said MOS capacitor, said lower metal layer providing a lower electrode of said FEM capacitor and an upper electrode of said MOS capacitor, said lower metal layer being formed of material taken from the group consisting of Pt, Ir, IrO$_2$ and Pt/Ir alloy, having a thickness of about 20 nm to 100 nm;

depositing on said lower metal layer a FE layer of material taken from the group consisting of Pb(Zr, Ti)O$_3$ (PZT), SrBi$_2$Ta$_2$O$_9$ (SBT), Pb$_5$Ge$_3$O$_{11}$, BaTiO$_3$ and LiNbO$_3$, having a thickness of about 50 nm to 400 nm; and depositing an upper metal layer of material on said FE layer to complete the layer of said FEM capacitor, said upper metal layer being taken from the group consisting of Pt, Ir IrO$_2$ and Pt/Ir alloy, having a thickness of 20 nm to 100 nm, the surface area of said FEM capacitor being less than said predetermined surface area of said MOS capacitor, whereby said stacked gate unit is in the form of an offset gate;

implanting doping impurities of a second conductivity type in the silicon device area on either side of the gate junction region to form a conductive channel of a second conductivity type for use as a source junction region and a drain junction region; and depositing an insulating structure about the stacked gate unit.

8. The method of claim 7 wherein forming a conductive channel of the first conductivity type includes implanting a dopant taken from the group consisting of B or BF$_2$ at an energy in a range of 3 keV to 10 keV or 15 keV to 50 keV, respectively, and a dose of $1 \cdot 10^{12}$cm$^{-2}$ to $1 \cdot 10^{14}$cm$^{-2}$ in the substrate.

9. The method of claim 7 wherein said step of implanting doping impurities of the second conductivity type includes doping the device area with ions taken from the group consisting of As, implanted at an energy of about 40 keV to 80 keV, and phosphorous, implanted at an energy of about 20 keV to 50 keV, the ions having a dose of about $1 \cdot 10^{15}$cm$^{-2}$ to $5 \cdot 10^{15}$cm$^{-2}$.

10. The method of claim 7 wherein said depositing an insulating structure about the FEM gate unit includes depositing a layer insulating material taken from the group consisting of TiO$_x$, and Si$_3$N$_4$.

11. The method of claim 6 in which the formation of said second MOS capacitor includes depositing a metal layer on both said MOS capacitor and said second MOS capacitor, said metal layer forming said lower metal layer which is deposited on said MOS capacitor, said metal layer providing the upper electrode of said MOS capacitor and the lower electrode of said FEM capacitor which is formed on said MOS capacitor, said metal layer further providing the upper electrode of said second MOS capacitor, the method further including the step of forming an electrical interconnect between said upper metal layer of said FEM capacitor and said metal layer which forms the upper electrode of said second MOS capacitor, whereby the leakage current through the memory device is limited by said second MOS capacitor.

12. The method of claim 7 including forming a second MOS capacitor alongside the stacked gate unit, including depositing a metal layer on both said MOS capacitor and said second MOS capacitor, said metal layer forming said lower metal layer which is deposited on said MOS capacitor, said metal layer providing the upper electrode of said MOS capacitor and the lower electrode of said FEM capacitor which is formed on said MOS capacitor, said metal layer further providing the upper electrode of said second MOS capacitor, the method further including the step of forming an electrical interconnect between said upper metal layer of said FEM capacitor and said metal layer which forms the upper electrode of said second MOS capacitor, whereby the leakage current through the memory device is limited by said second MOS capacitor.

* * * * *